United States Patent
Bartek

(10) Patent No.: US 6,737,978 B1
(45) Date of Patent: May 18, 2004

(54) VOLTAGE TESTING APPARATUS FOR ELECTRICAL RAILWAYS

(76) Inventor: Peter M. Bartek, 9 Old Traveled Way, Ledgewood, NJ (US) 07852

( * ) Notice: Subject to any disclaimer, the term of this patent is extended or adjusted under 35 U.S.C. 154(b) by 143 days.

(21) Appl. No.: 10/287,948

(22) Filed: Nov. 6, 2002

(51) Int. Cl.⁷ .............................................. G08B 21/00
(52) U.S. Cl. ..................... 340/660; 340/662; 340/663; 340/691.6; 340/692; 324/539; 324/543
(58) Field of Search ................... 340/660, 662, 340/663, 691.6, 692; 324/539, 543

(56) References Cited

U.S. PATENT DOCUMENTS 5,170,429 A * 12/1992 Stocklin et al. ............ 379/387
5,650,728 A * 7/1997 Rhein et al. ................ 324/543

* cited by examiner

Primary Examiner—Daniel J. Wu
Assistant Examiner—Tai T. Nguyen
(74) Attorney, Agent, or Firm—William Nitkin

(57) ABSTRACT

A voltage testing apparatus for electrical railways is disclosed consisting in one embodiment of a transportable pole-mounted electrical power indicator, electrically conducting wire-engaging means such as a hook attached to one end of the pole and electrically connected to the indicator, and a ground-connecting device such as an electrically conducting magnet also electrically connected to the indicator. An electrical circuit is completed between the cable, the indicator and the rail by placing the hook on an overhead railway cable and attaching the magnet to a roadbed rail. An LED array and voltmeter configuration constituting the indicator illuminate and show whether voltage is present.

14 Claims, 5 Drawing Sheets

VOLTAGE TESTING APPARATUS FOR ELECTRICAL RAILWAYS

BACKGROUND OF THE INVENTION

1. Field of the Invention

The device of this invention resides in the field of electrical testing devices and more particularly relates to the determination of the electrical condition of overhead lines and third rail lines for direct current electrical railway systems, such device including a multiple LED warning light with built-in volt meter and optional audio alarm to provide multiple indications as to the energized state of such overhead lines and third rail lines.

2. Description of the Prior Art

Determining the energized state of overhead lines and third rail lines for an electrically operated rail line for direct current has been heretofore carried out by very basic devices and methods. One approach is a series of incandescent lamps which light or not depending upon the presence of power in the line. The incandescent light bulbs are used in a series circuit so that a voltage drop across each bulb would be equal to the rated voltage of such bulb. For example, a 600 volt line would use five bulbs in series, referred to as a five-light cluster, so that a voltage drop of approximately 120 volts would be achieved. There are many problems with five-light clusters in that the voltage functionally caused the bulbs to glow brightly, as the voltage increased, or dimly, as the voltage decreased. These voltage changes tend to weaken the filaments in the bulbs; and such filaments, when broken in one of the bulbs in the series of five, cause an open circuit, thus causing the other four bulbs to go dark. This situation would create a false indication of the voltage in the lines being tested which the user of the five-light cluster would wrongly assume were de-energized. Trouble shooting a five-light cluster is difficult as each old bulb has to be removed and a new bulb substituted therefor until the defective bulb could be found. Such need for substitution of bulbs also required having spare bulbs always available on site. Users of the five-light clusters are further usually unable to prevent vibrations and shock damage to the five-light clusters during their transportation to the work site. Such vibrations and shocks cause the filaments of the bulbs to weaken or break and can cause the glass globes of the bulbs to break, further increasing the unreliability of the five-light cluster. One improvement made over the five-light cluster is the use of a single incandescent bulb in an electrical series circuit with a resistor to provide a voltage drop. The advantage of the use of such single incandescent bulb over the five-light cluster is that only one bulb needs to be changed when the bulb fails, but the light output is greatly diminished due to its having only one light rather than five. A further disadvantage is that heat is generated from the resistor.

The prior art incandescent warning devices can be either attached by hand wiring to the lines being tested such as being fixed in a permanent location, or such devices can be placed on a long pole with a metal hook at one end. The metal hook can be mounted on a wooden pole and placed on a messenger wire up to 25 feet above the track. However, such devices are heavy and cumbersome, and some workers encounter much difficulty in raising the pole and hooking it to the wire.

Another method of determining the energized state of overhead lines and third rail lines is the hand use of a voltmeter to read line voltage at disconnect switches. Voltmeters can also be attached to a pole with such a metal hook as previously described wherein the voltage would pass from the metal hook down a wire to the voltmeter. In some cases rather than a hook with a wire leading to the voltmeter, a ladder is placed against the wires and a worker would climb up and put the positive wire lead against the messenger and contact wires for one connection. The negative wire lead of the voltmeter would then be connected to the running rail to complete the circuit to give an indication of the voltage level on the lines being tested. Such voltage measuring procedures do not provide for the safer remote indication of the voltage since the person reading the voltmeter's voltage display must be in a proximate location to the device in order to read it.

Thus, the prior art requires either climbing a support pole for hand checking with a voltmeter, or the use of fragile and somewhat unreliable incandescent light bulbs which bulbs in particular are subject to globe breakage or filament breakage from changing temperatures, environmental vibrations, movement by the user or just wearing out.

In contrast, the present invention provides a safe, reliable and accurate system for determining the power status of overhead lines and third rail lines which system can be used at ground level without the need for climbing a support pole or subjecting the user to being in close proximity to the lines being tested.

SUMMARY OF THE INVENTION

The invention may be summarized as a voltage testing apparatus for determining the power condition of overhead lines and third rail lines, such invention consisting of a telescopic pole, a voltage indicator, a ground connection device such as a transport rail attachable magnet, and connection wires to provide an electrical circuit between the cable, indicator and ground.

The indicator is mounted on the pole which may be extendible and retractable and has an electrically conducting cable engaging device, such as a hook mounted on one end. A wire connects the hook and indicator, and another wire connects the magnet and indicator. When the magnet is placed on the running rail and the hook is lifted to and either placed on the overhead line, a circuit is created which will establish the power status of the cable. On a third rail system the wire to the hook can be disconnected therefrom and attached to a second magnet to be adhered to the voltage-carrying power rail of a third rail line.

Thus it is an object of this invention to provide an easily visible, audible and easily readable digital voltage display device that provides an indication of the electrical condition of messenger and contact wires, contact rails and the power rail of a third rail line as utilized on electrical railway systems, with LED warning lights providing a highly visible warning to any workers to avoid coming into direct contact with the electrical wires and conductors that are energized with voltage. The array of LED warning lights are connected in an electrical series circuit with a plurality of such circuits connected in parallel with one another so as to create, when illuminated, an intensely bright display capable of being seen even in direct sunlight. Even if one or more LEDs should burn out, the other interconnected strings of LEDs are not affected, and the unit will continue to provide a very bright display even in the event of numerous LED string burn outs. Further the strings of LEDs are arrayed within a clear plastic globe housing in a 360-degree circle so that they are visible from all directions. The clear plastic globe provides complete and total encapsulation so as to protect the LEDs and other components from impact, moisture and other damage that prior art systems are exposed to.

The indicator can include an array of LEDs, a voltmeter and an audible alarm. The indicator can also be enclosed in such clear plastic globe housing for the protection of the user against shock and to protect the indicator from the environment. The LED array can be multisided to provide for observation from a variety of horizontal positions and the housing transparent to allow such observation. Further, different colors of LEDs can be used to indicate different power conditions, for example, red for power and green for no power. Finally, a nonconductive handle can be attached to the magnet to assist in its placement and removal and for safety for the user against shocks. Alternatively, a ground contact can be provided by a second hook disposed at the same end of the pole as the first hook to simultaneously engage an overhead ground cable. The digital voltmeter is positioned on the top of the LED array and is actuated by pressing a button on the lower side of the device to give an indication of the actual voltage on the electrical power lines being tested. The voltmeter can also provide a circuit integrity test to determine whether the indicator is functioning properly. The voltmeter is powered by a replaceable 9-volt battery installed in the base of the housing of the device of this invention. The housing of the device of this invention can be made of high impact-resistant, non-electrically conducting plastic which will absorb shock should the device be dropped or struck. The transparent globe housing can be unscrewed from the lower base to gain access to the LED array. The LED array is removable from the housing to gain access to the voltmeter battery. The lower part of the housing is constructed with four threaded knockout openings for the installation of electrical connectors, bushings or tubings, such openings being situated 90-degrees apart around the base which is generally cylindrical in configuration. One of the openings allows the positive and negative wires that are measuring the power to be directed to the LED array. The bottom of the base is flat for easy mounting on surfaces or on other components. The audio warning device can be a horn with a loudness level of 120 decibels at 600 volts. The horn speaker can be internally located in an opening on a side of the housing.

The digital voltmeter can be located on top of the digital array facing upwards and visible through the clear plastic housing. The voltmeter can be activated by a test button located on the side of the housing.

These and other features and advantages of the invention will become more apparent from the description of the preferred embodiment(s) and drawings which follow.

DESCRIPTION OF THE PREFERRED EMBODIMENT(S)

Figure 1:
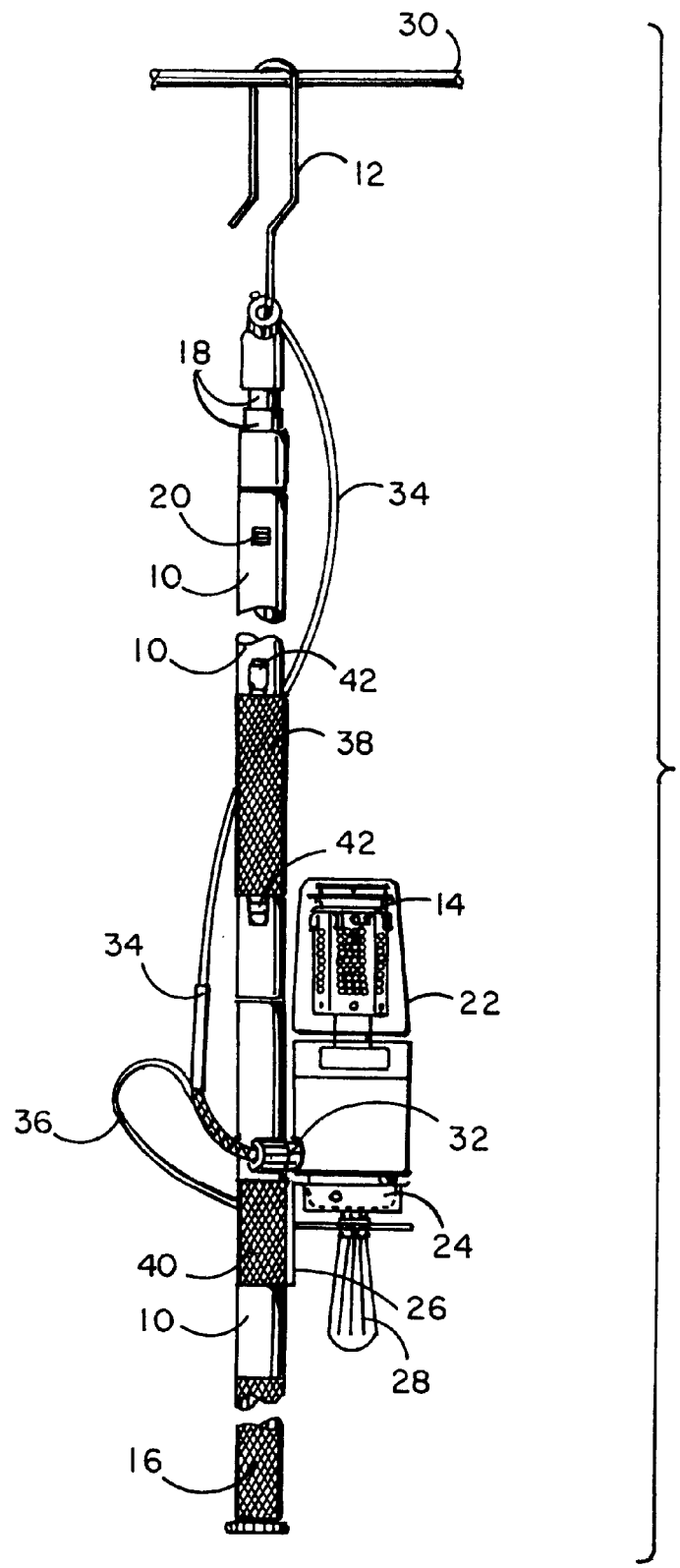
FIG. 1 illustrates a plan view of the preferred embodiment of the invention.

Referring first to FIG. 1, there is illustrated a plan view of the preferred embodiment of the invention. Telescopic pole 10 has electrically conducting cable-engaging apparatus hook 12, for example, mounted on one end. The opposite end has an electrical power indicator, such as LED array 14 mounted thereon. Handle 16 provides means to grip pole 10 which may be extendible and retractable using telescoping members 18 locked and released by button 20.

LED array 14 is shown enclosed in partially transparent case 22, comprised, for example, of a non-conducting high-impact plastic below which is mounted magnet 24 on bracket 26. Non-conducting handle 28 provides means to attach and remove magnet 24 from, for example, a grounding point in the vicinity of the overhead line 30 to establish a ground.

Figure 2:
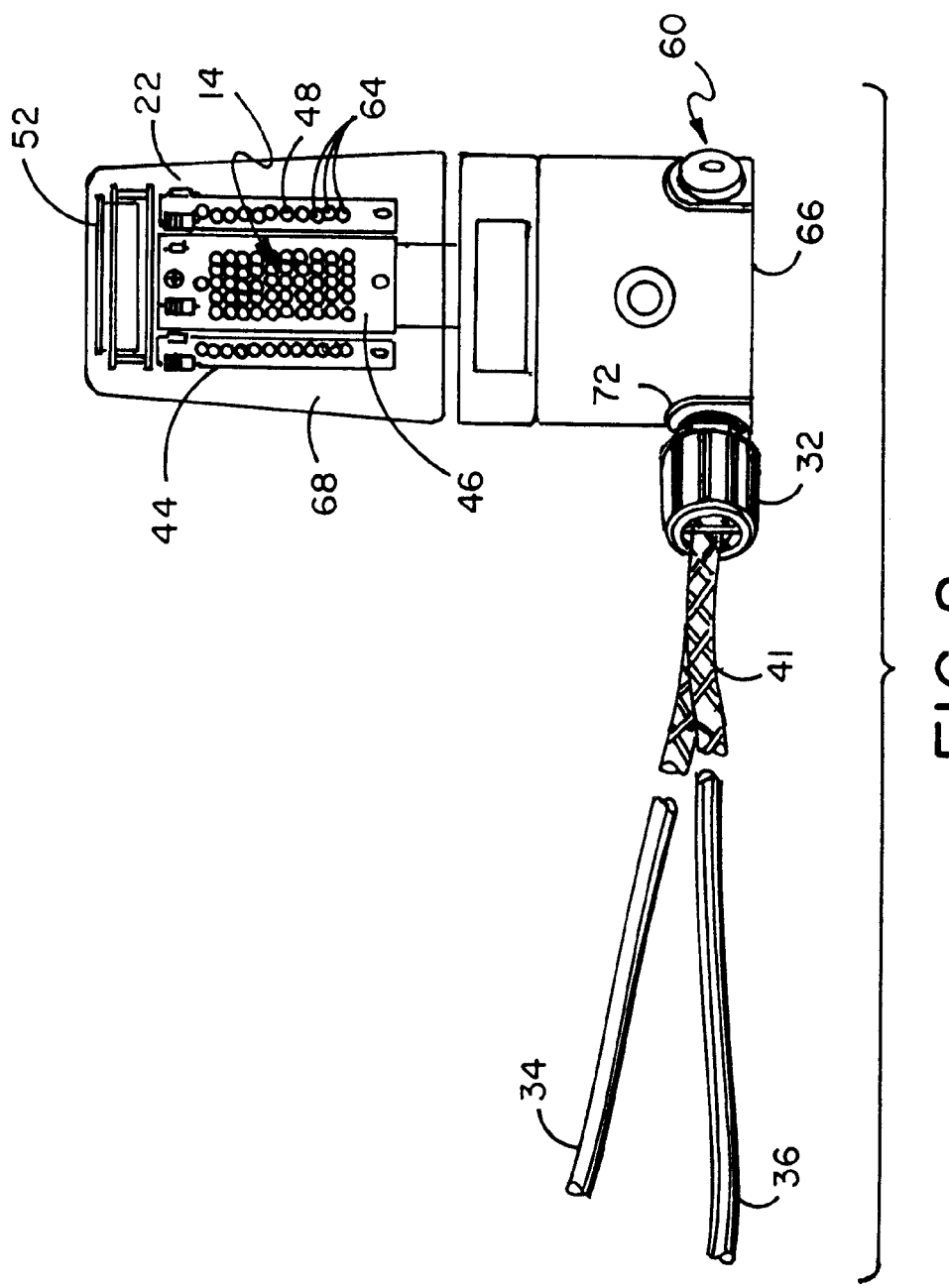
FIG. 2 illustrates a perspective view of the LED array and housing component of FIG. 1.

In FIG. 2 cable junction 32 is shown attached to case 22 and provides a common access point for first cable 34 connected to hook 12 and second cable 36 connected to magnet 24. Each cable is bunched prior to use of the invention in first and second bundles 38 and 40, respectively. A cable strain relief wrap 41 is used to keep the cables from pulling out of first tapped hole 72, and they can be secured on cable bracket 42 such as that illustrated for cable 34.

Figure 3:
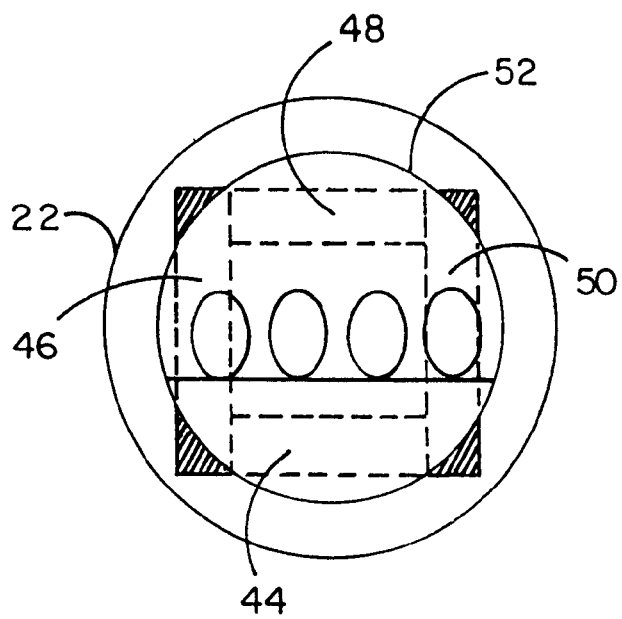
FIG. 3 illustrates a top view of the component of FIG. 2.

For increased safety, LED array 14 can consist of three or more panels to allow visual observation from any horizontal position. FIG. 2 is a perspective illustration of a four panel array, two of which are shown as first panel 44 and second panel 46. Two others, third panel 48 and fourth panel 50 are symmetrically disposed, respectively, on opposite sides of first panel 44 and second panel 46, as indicated in FIG. 3 which illustrates a top view of the LED array of FIG. 2. First, second, third and fourth panels 44, 46, 48 and 50, each made of circuit boards on which a plurality of light-emitting diodes 64 are arrayed, are mounted to base 66 into which base 66 transparent globe 68 is screwed to form a watertight seal. Within base 66 is positioned a 9-volt battery 70 and an audible alarm 60. Electrical power is transmitted to LED array 14 through first and second cables 34 and 36 which carry the positive and negative poles of the voltage, respectively. In one embodiment first cable 34 is connected through hook 12 to an energized or de-energized positive line or cable to be tested while second cable 36 is connected to the negative ground which could be a running rail, such as rail 58 seen in FIG. 5, or a negative overhead contact wire, such as ground cable 56, seen in FIG. 4. First and second cables 34 and 36 enter base 66 through a first tapped hole 72 which is formed therein and is adapted to accept standard electrical industry cable junctions, such as cable junction 32. When electrical power is transmitted through first and second cables 34 and 36 to LED array 14, all four panels 44, 46, 48 and 50 glow brightly when receiving full voltage. If the audible alarm is utilized, it will emit a loud piercing sound at 120 decibels. Thus the light and sound intensity is governed by the voltage so that as the voltage decreases, the light and sound intensity decreases; and vice versa, as the voltage increases, the light and sound intensity increases, giving warning to workers that the high-voltage lines are energized. A warning label can be placed conspicuously on the side of the base to provide information about the hazard warning.

Also shown in the top view of FIG. 3 is voltmeter 52 positioned above LED array 14 which voltmeter 52 can serve as an alternative power indicator. The display of the voltmeter is in four digits to provide an indication of the voltage level on the line being tested. For example, if 600 volts are on the line, the display will read "600." If there is no voltage on the line, such as when the line is de-energized, voltmeter 52 will display "000." Voltmeter 52 and LED array 14 are connected independent of one another such that a failure of the voltmeter will not prevent LED array 14 from illuminating when voltage is present; and vice versa, should the LED array fail, the voltmeter would still indicate the line voltage. Also, audible alarm 60 is independently connected of both LED array 14 and voltmeter 52.

Figure 4:
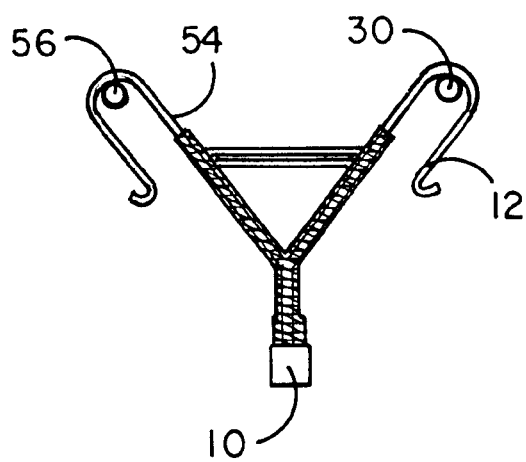
FIG. 4 illustrates a plan view of an alternative component of FIG. 1.

FIG. 4 illustrates an alternative ground-engaging device consisting of second hook 54 attached to pole 10 for engaging ground cable 56. Second hook 54 is electrically insulated from hook 12 and electrically connected to LED array 14.

Figure 5:
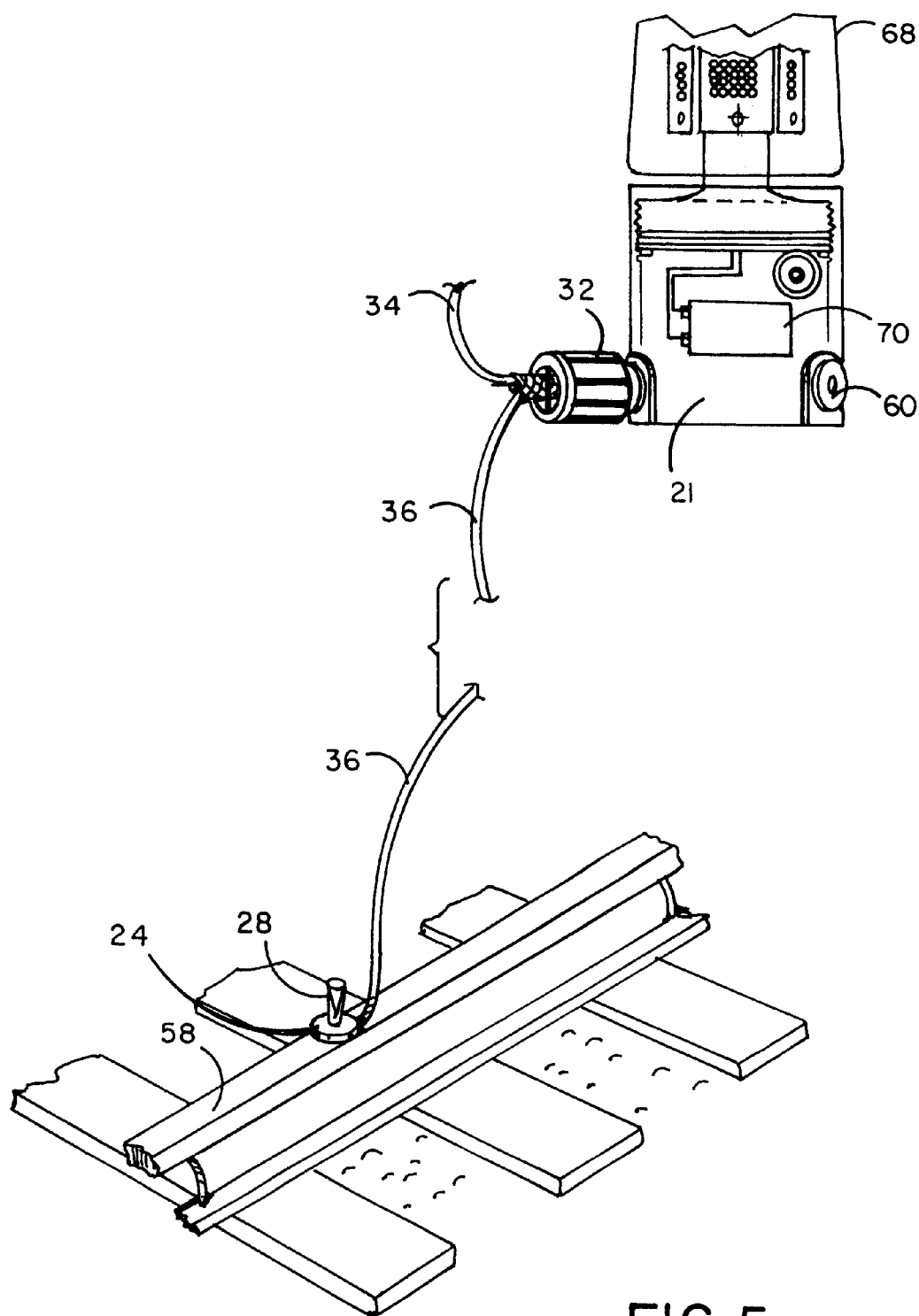
FIG. 5 illustrates a perspective view of another component of FIG. 1.
Figure 6:
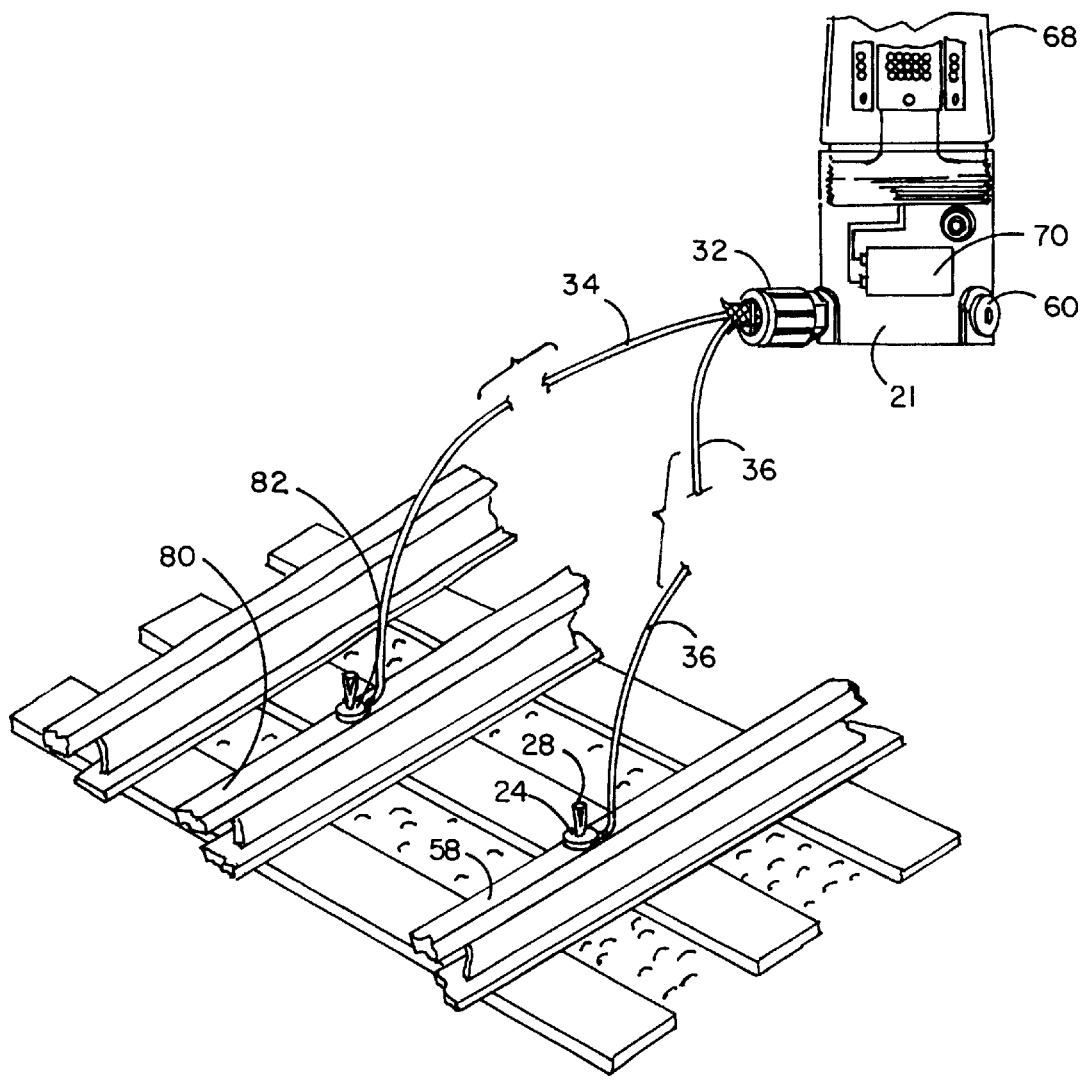
FIG. 6 illustrates a perspective view of the apparatus of this invention used with a third rail power system.

FIG. 5 illustrates the employment of magnet 24 as a ground-engaging device magnetically affixed to rail 58. When used with third rail power systems, as seen in FIG. 6, first cable 34 can have a similar magnetic connector 82 as that attached to ground rail 58 while magnet connector 82 can be magnetically affixed to third power rail 80. Further shown is audible alarm module 60 which is connectable to the electrical circuitry described above through first connector 62 in case 22. In addition to providing an audible signal for a condition of either power or no power, the module can provide additional visual information, be an alternative mounting platform for the voltmeter, or contain battery systems for supplying operating power to the indicators when a no power condition exists in the overhead cable.

Although the present invention has been described with reference to particular embodiments, it will be apparent to those skilled in the art that variations and modifications can be substituted therefor without departing from the principles and spirit of the invention.

I claim:

1. A voltage testing apparatus for an electrical railway having an overhead power cable and a ground, comprising in combination:

a transportable pole having a first end and a second end;

electrically conducting cable-engaging means comprising a hook attached to said first end of said pole for electrically contacting said overhead power cable;

an electrical power indicator having a perimeter, said electrical power indicator comprising an LED array of at least three LED panels positioned about said perimeter, said LED array visible from any horizontal location, said electrical power indicator electrically connected to said cable engaging means;

an enclosure for said electrical power indicator at least partially transparent whereby said electrical power indicator can be observed from outside said enclosure; and ground engaging means electrically connected to said electrical power indicator, said ground engaging means arranged to connect to said ground to complete an electrical circuit between said cable, said electrical power indicator and said ground.

2. The apparatus of claim 1 wherein said ground comprises a transport rail, and said ground engaging means comprises an electrically conducting magnet.

3. The apparatus of claim 1 wherein said ground comprises a second overhead cable, and said ground engaging means comprises a second hook attached to said first end of said pole.

4. The apparatus of claim 1 wherein said electrical power indicator further includes a voltmeter.

5. The apparatus of claim 1 wherein said electrical power indicator further includes an audible alarm.

6. The apparatus of claim 1 wherein said pole is expandable and retractable in length.

7. The apparatus of claim 2 further including an electrically non-conducting handle attached to said magnet.

8. The apparatus of claim 1 wherein said enclosure is shockproof, watertight and comprised of a non-conducting, high-impact plastic.

9. A voltage testing apparatus for an electrical railway having a third power rail and a ground rail, comprising in combination:

an electrical power indicator having a perimeter, said electrical power indicator comprising an LED array of at least three LED panels positioned about said perimeter, said LED array visible from any horizontal location, said electrical power indicator electrically connected to said third power rail;

an enclosure for said electrical power indicator at least partially transparent whereby said electrical power indicator can be observed from outside said enclosure; and ground rail engaging means electrically connected to said electrical power indicator, said ground engaging means arranged to connect to said ground to complete an electrical circuit between said power rail, said electrical power indicator and said ground rail.

10. The apparatus of claim 9 wherein said electrical power indicator further includes a voltmeter.

11. The apparatus of claim 9 wherein said electrical power indicator further includes an audible alarm.

12. The apparatus of claim 9 wherein said electrical connections to said third power rail and said ground rail are by magnets.

13. The apparatus of claim 12 further including electrically non-conducting handles attached to said magnet.

14. The apparatus of claim 9 wherein said enclosure is shockproof, watertight and comprised of a non-conducting, high-impact plastic.

\* \* \* \* \*